United States Patent
Jensen et al.

(10) Patent No.: US 9,304,160 B1
(45) Date of Patent: Apr. 5, 2016

(54) DEFECT INSPECTION APPARATUS, SYSTEM, AND METHOD

(71) Applicants: Earl Jensen, Santa Clara (CA); Christopher Kirk, Beaconsfield (GB)

(72) Inventors: Earl Jensen, Santa Clara (CA); Christopher Kirk, Beaconsfield (GB)

(73) Assignee: KLA-Tencor Corporation, Milpitas, CA (US)

( * ) Notice: Subject to any disclaimer, the term of this patent is extended or adjusted under 35 U.S.C. 154(b) by 120 days.

(21) Appl. No.: 13/886,671

(22) Filed: May 3, 2013

Related U.S. Application Data

(60) Provisional application No. 61/644,172, filed on May 8, 2012.

(51) Int. Cl.
| G01R 31/08 | (2006.01) |
| G01R 31/26 | (2014.01) |
| G01R 31/305 | (2006.01) |
| G01R 31/307 | (2006.01) |

(52) U.S. Cl.
CPC .......... *G01R 31/2601* (2013.01); *G01R 31/305* (2013.01); *G01R 31/307* (2013.01)

(58) Field of Classification Search
CPC . H01J 37/28; H01J 2237/2817; H01J 37/265; H01J 37/244; H01J 2237/28; H01J 2237/2448; H01L 22/12; H01L 22/34; H01L 21/67213; G06T 2207/10061; G06T 1/0007; G01N 23/225; G01N 23/2251; G01N 21/9501; G01N 23/227; G01R 31/305; G01R 31/2653; G01R 31/2601

USPC .......... 250/310, 307, 306, 311, 492.3, 492.2; 324/501, 762.01, 762.05, 754.22
See application file for complete search history.

(56) References Cited

U.S. PATENT DOCUMENTS

| 4,845,373 | A | 7/1989 | Jamieson et al. |
| 6,021,380 | A | 2/2000 | Fredriksen et al. |
| 6,052,478 | A | 4/2000 | Wihl et al. |
| 6,524,873 | B1 * | 2/2003 | Satya et al. ..................... 438/18 |
| 6,559,662 | B1 | 5/2003 | Yamada et al. |
| 6,774,646 | B1 * | 8/2004 | Han et al. ................. 324/754.22 |
| 6,855,568 | B2 | 2/2005 | Weiner et al. |

(Continued)

FOREIGN PATENT DOCUMENTS

| EP | 0628988 B1 | 2/2002 |
| EP | 1944614 A1 | 7/2008 |

(Continued)

OTHER PUBLICATIONS

U.S. Appl. No. 14/536,428, to Earl M. Jensen, filed Nov. 7, 2014.

(Continued)

*Primary Examiner* — Daniel Miller
(74) *Attorney, Agent, or Firm* — Joshua D. Isenberg; JDI Patent

(57) ABSTRACT

Aspects of the present disclosure describe an inspection apparatus which performs inspection on a smaller field of a wafer with structures for current collection. The defective via holes may be located based on the collected current. It is emphasized that this abstract is provided to comply with the rules requiring an abstract that will allow a searcher or other reader to quickly ascertain the subject matter of the technical disclosure. It is submitted with the understanding that it will not be used to interpret or limit the scope or meaning of the claims.

23 Claims, 6 Drawing Sheets

(56) References Cited

U.S. PATENT DOCUMENTS

| | | |
|---|---|---|
| 7,540,188 B2 | 6/2009 | Wiese et al. |
| 7,555,948 B2 | 7/2009 | Wiese et al. |
| 7,804,248 B1 | 9/2010 | Li et al. |
| 7,855,549 B2 | 12/2010 | Renken et al. |
| 8,698,081 B2 | 4/2014 | Nakamura et al. |
| 8,889,021 B2 | 11/2014 | Jensen et al. |
| 8,970,201 B2 | 3/2015 | Durkheim |
| 2003/0146381 A1* | 8/2003 | Simon et al. ............... 250/310 |
| 2005/0052192 A1* | 3/2005 | Hung ............................ 324/751 |
| 2006/0290911 A1* | 12/2006 | Jung ............................ 355/53 |
| 2008/0096295 A1 | 4/2008 | Hasebe et al. |
| 2009/0212793 A1* | 8/2009 | Guldi et al. ................. 324/751 |
| 2009/0251160 A1 | 10/2009 | Miyazaki |
| 2011/0157569 A1* | 6/2011 | Baek et al. .................. 355/55 |
| 2011/0180903 A1 | 7/2011 | Hata |
| 2012/0098954 A1 | 4/2012 | Yamaguchi et al. |
| 2012/0203495 A1 | 8/2012 | Sun et al. |
| 2012/0319866 A1 | 12/2012 | Svoen et al. |
| 2013/0155390 A1 | 6/2013 | Jensen et al. |
| 2014/0122654 A1 | 5/2014 | Jensen |
| 2014/0192840 A1 | 7/2014 | Sun et al. |

FOREIGN PATENT DOCUMENTS

| | | |
|---|---|---|
| JP | H05215776 A | 8/1993 |
| JP | 2010129755 A | 6/2010 |
| JP | 2011002386 A | 1/2011 |
| WO | 2007114642 A1 | 10/2007 |
| WO | 2010089954 A1 | 8/2010 |
| WO | 2011092433 A1 | 8/2011 |

OTHER PUBLICATIONS

U.S. Appl. No. 61/644,172, to Earl M. Jensen, filed May 8, 2012.

* cited by examiner

DEFECT INSPECTION APPARATUS, SYSTEM, AND METHOD

CLAIM OF PRIORITY

This application claims the priority benefit of commonly owned, U.S. Provisional Patent Application No. 61/644,172, to Earl Jensen et al, filed May 8, 2012, and entitled "INSTRUMENT TO QUICKLY FIND PARTIALLY FULLY OBSTRUCTED VIA HOLES" the entire disclosures of which are incorporated herein by reference.

FIELD OF THE INVENTION

Embodiments of the present invention relate to the field of inspection and analysis of specimens, and more particularly, to a defect inspection apparatus and method on semiconductor wafers using electron beams.

BACKGROUND OF THE INVENTION

Semiconductor fabrication processes are among the most sophisticated and complex processes in manufacturing. Monitoring and evaluation of semiconductor fabrication processes on the circuit structures and other types of structures, (e.g., resist structures), is necessary to ensure the manufacturing accuracy and to ultimately achieve the desired performance of the finished device. With the development trend in miniature electronic devices, the ability to examine microscopic structures and to detect microscopic defects becomes crucial to the fabrication processes.

Various technology and methods of defect inspection on patterns or structures formed on semiconductor wafers have been developed and employed with varying degrees of success. For example, an optical inspection method employs an optical inspection device such as an optical microscope for inspecting pattern shapes for defects. As pattern shapes and structures become finer, it is difficult to detect defects using an optical method due to its wavelength limitation. Accordingly, there has been proposed a method of defect detection on fine pattern shapes using an electron beam.

Electron beam inspection uses an SEM (scanning electron microscope) to detect electrical and/or physical defects on a semiconductor wafer. In general, SEM is a type of electron microscope that produces images of a sample by scanning it with a focused electron beam. One application of electron beam inspection is to perform inspection of conductive features such as interconnects and through-vias to detect electrical defects such as electrical shorts, electrical opens or resistive shorts/open, etc. Specifically, the interaction of the electron beam with electrons in the sample generates a number of signals in varying intensities, which may contain information about the sample's features (e.g., its surface topography and composition). The type of signals produced by a SEM includes secondary electrons, back-scattered electrons, x-rays, specimen current and transmitted electrons, etc. Defects may be detected based on these signals. For example, one of the commonly known inspection techniques, sometimes called the voltage contrast technique, employs secondary electron signals for defect detection. Voltage contrast inspection operates on the principle that the potential differences in the various locations of a wafer under examination cause differences in secondary electron emission intensities. Thus, the potential state of the scanned area may be acquired as a voltage contrast image such that a low potential portion of, for example, a wiling pattern might be displayed as bright (intensity of the secondary electron emission is high) and a high potential portion might be displayed as dark (lower intensity secondary electron emission). Alternatively, the system may be configured such that a low potential portion might be displayed as dark and a high potential portion might be displayed as bright. A secondary electron detector is employed to measure the intensity of the secondary electron emission that originates at the path swept by the scanning electron beam. A defective portion can be identified by, for example, comparing the defective voltage contrast image and the defect free image.

Defect detection using an electron beam has a problem in that the readout bandwidth (and therefore throughput) and the signal to noise are severely hampered by the large substrate parasitics, e.g., a large parasitic capacitance. As a result, the time necessary for large area inspection is signification and may take several days and even months. Accordingly, it is desirable to improve electron beam inspection techniques and particularly to increase the throughput of electron beam inspection of semiconductor wafers and other substrates.

SUMMARY OF THE INVENTION

The present disclosure discloses a system for detecting defects in test structures. The system operates so as to provide efficient and effective testing of defects. It also includes test structures that provide for improved defect testing.

According to aspects of the present disclosure, a semiconductor wafer for use in defect inspection comprises a semiconductor substrate, a dielectric layer provided on top of the semiconductor substrate, and a number of current collection structures provided over the dielectric layer. The plurality of current collection structures covers a field that is the size of a lithography exposure field or smaller. Each current collection structure in the plurality includes a conductive pad that is smaller than the field. Each current collection structure is electrically connected to a corresponding exposed probe contact on a surface of the substrate.

According to additional aspects of the present disclosure, a defect inspection system comprises an electron beam tool configured to emit one or more electron beams for addressable inspection of a plurality of holes within a field on a wafer. The wafer has a plurality of current collection structures in the field. Each current collection structure in the plurality includes a conductive pad that is smaller than the field. Each current collection structure is electrically connected to a corresponding exposed probe contact on a surface of the substrate. The current collection structures are electrically isolated from each other by a dielectric layer over the substrate of the wafer. The system further comprises a chamber to receive the wafer, an array of amplifiers to receive collected current information from the current collection structures, and a display and control device receiving the enhanced current information and configured to display a current image and locate defects based on the current image.

According to another aspect of the present disclosure, a process for defect inspection on a limited field of a semiconductor wafer, comprises the steps of forming a patterned photoresist layer with a pattern of developed holes over one or more current collection structures on a test wafer substrate, addressably scanning the pattern of developed holes with one or more electron beams, receiving current information of the developed holes through the current collection structures, displaying a current image showing current with respect to location of the developed holes, and locating defective holes based on the current image. Each collection structure is smaller than the substrate. Each collection structure is electrically connected to a corresponding probe contact on the substrate.

BRIEF DESCRIPTION OF THE DRAWINGS

Objects and advantages of the invention will become apparent upon reading the following detailed description and upon reference to the accompanying drawings in which.

DESCRIPTION OF THE SPECIFIC EMBODIMENTS

Figure 1A:
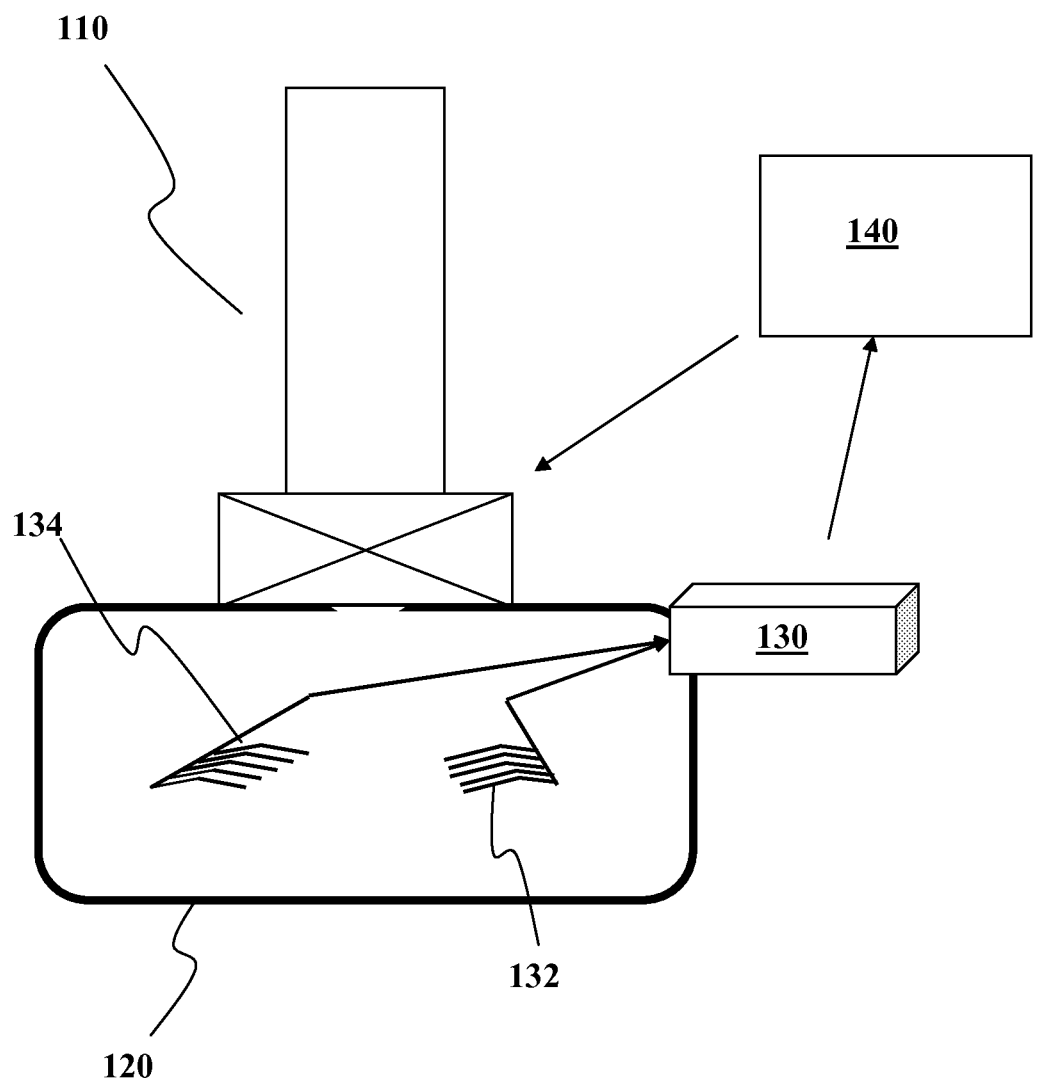
FIG. 1A illustrates an inspection apparatus according to an aspect of the present disclosure.

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention. Additionally, because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention.

In this document, the terms "a" and "an" are used, as is common in patent documents, to include one or more than one. In this document, the term "or" is used to refer to a nonexclusive "or," such that "A or B" includes "A but not B," "B but not A," and "A and B," unless otherwise indicated. The following detailed description, therefore, is not to be taken in a limiting sense, and the scope of the present invention is defined by the appended claims. "Optional" or "optionally" means that the subsequent described circumstance may or may not occur, so that the description includes instances where the circumstance occurs and instances where it does not. For example, if a device optionally contains a feature A, this means that the feature A may or may not be present, and thus, the description includes both structures wherein a device possesses the feature A and structures wherein the feature A is not present. It is to be further understood that when a layer is described as being "on" or "over" another layer or substrate, such layer may be directly on the other layer or substrate, or intervening layers may also be present. In addition, similar reference numerals used throughout the drawings denote elements having the same or similar functions.

Aspects of the present disclosure allow an inspection apparatus to quickly locate partially and fully obstructed via holes. Embodiments of the present inspection apparatus perform inspection on a smaller field of a wafer (e.g., a test wafer) with a current receiver (e.g., a Faradaic current receiver) to locate defective via holes based on the collected current. By scanning a smaller field, the defects in the entire wafer may be uncovered because the defects are repeated across the wafer. As such, the readout bandwidth and the throughput of electron beam inspection can be increased.

Exemplary embodiments of an electron beam inspection apparatus to detect defects on semiconductor wafers will now be described more fully with reference to the schematic illustrations of FIGS. 1-5 where it is to be understood that the thickness and dimensions of various structures, layers and regions of semiconductor devices illustrated in the figures are not to scale but rather exaggerated for clarity.

Figure 1B:
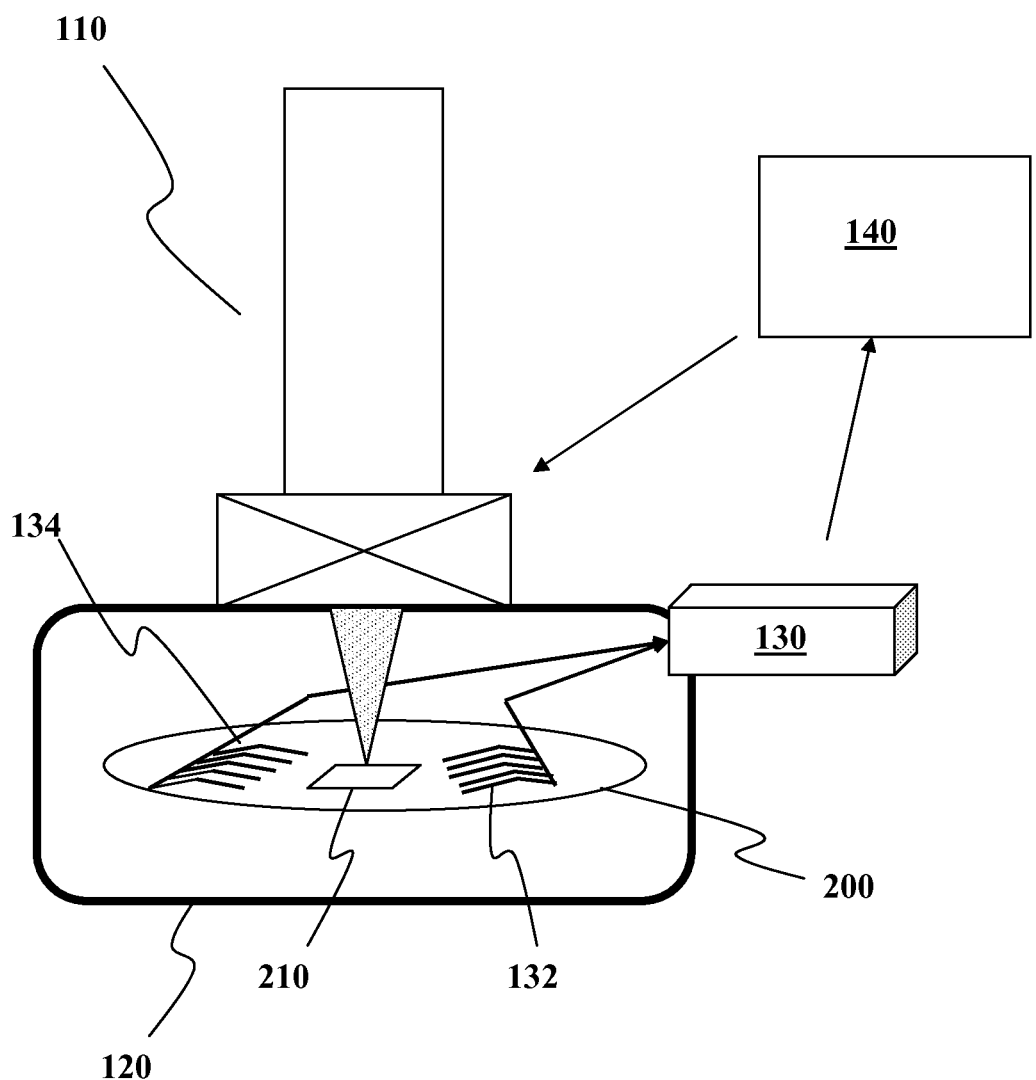
FIG. 1B illustrates an inspection apparatus of FIG. 1A for inspection on a wafer according to an aspect of the present disclosure.

FIG. 1A shows one embodiment of the inspection apparatus according to the present disclosure. The inspection apparatus 100 includes an electron beam tool 110, a chamber 120, an array of amplifiers 130, and a display and control device 140. FIG. 1B shows an inspection apparatus of FIG. 1A for inspection on a test wafer 200 with current collection structures in according to the present disclosure. It should be noted that same reference numerals used in FIG. 1A and FIG. 1B denote identical elements.

The electron beam tool 110 may include a field emission electron source to provide an electron beam and a charged particle beam column to deliver and scan the electron beam from the field emission electron source on a surface of the test wafer 200. According to the present disclosure, the field of inspection is limited to a scanner field of view of about 26 mm×33 mm. Additionally, the electron beam tool 110 may include a programmable e-beam pattern generator that allows scanning only the holes under test instead of continuously scanning across the entire scanner field of view. Specifically, the location of each hole under test may be first identified by the commonly known techniques, such as scanning capacitance microscopy (SCM). The electron beam tool 110 with a programmable e-beam pattern generator may be configured to address a given hole under test and move to address to the next hole once the current information of the first hole is collected. As such, the holes in the scanner field of view may be scanned with 100% coverage in less than 1 hour.

In addition, a field of holes in the resist may be formed by exposure with a scanner in such a way that scanner focus and scanner intensity vary across the field. The field may be scanned in a predetermined pattern of so that each hole corresponds to a different combination of focus and intensity. By way of example, the field of holes may be arranged in a pattern of rows and columns. During resist exposure with the scanner, the scanner intensity may be fixed for a row of holes and focus may vary for each column along the row. If a different intensity is used for each row, each hole will correspond to a particular combination of focus and intensity. After developing, the quality of holes may be examined, e.g., by using SEM as described above. Based on the quality of the developed holes, an optimum focus and intensity for production wafers may be selected.

A chamber 120 may provide a suitable environment for the test wafer 200. The chamber 120 may be a vacuum chamber. A desired atmosphere in the chamber 120 may be obtained by evacuating and re-pressurizing the chamber with exhaust and gas handling systems as are common in the art. An array of amplifiers 130 outside of the chamber 120 may receive current information through corresponding probing pins 132 of a probe card 134. The probing pins 132 may be electrically connected to current collectors on the wafer (e.g., pads 220, which are described below) on the test wafer 200 In this way, an electron beam current from the electron beam tool 110 to each collector may be separately measured. The contact to a probing pin 132 may be made at the top of the wafer or at the bottom of the wafer trough a through-the-wafer-via. The amplifiers 130 may be configured to apply a programmable DC bias to the corresponding probe pin 132 and pad 220 to enhance current collection by repulsion or attraction. Alternatively, the amplifiers may be built into the silicon wafer. The display and control device 140 may include a display, a memory, and a processor. The display and control device 140 receives the amplified current information from the amplifiers 130. The display and control device 140 may display a beam current image with respect to location of the addressed holes. Defective holes may be easily detected in the current image. For example, defect holes may show up as bright spots in the image due to charging. Software may be employed to analyze pass/fail maps. Additionally, the resulting current image may be overlaid onto a regular SEM image for visualization. In one example, the readout instrumentation is a KLA-Tencor SEM tool (Ebeam Inspector) with readout electronics.

Figure 2A:
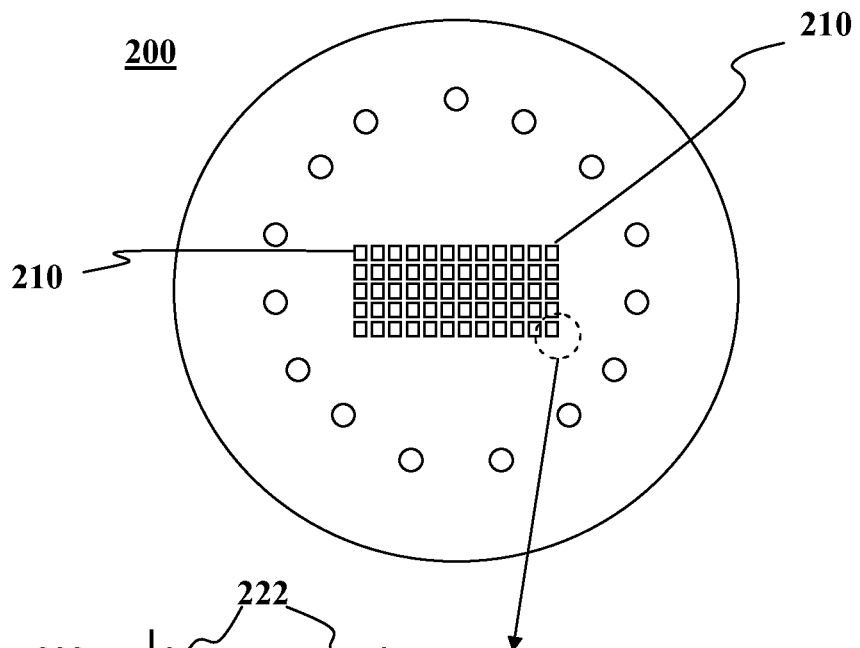
FIG. 2A illustrates a semiconductor wafer that is prepared in accordance with an aspect of the present disclosure.
Figure 2B:
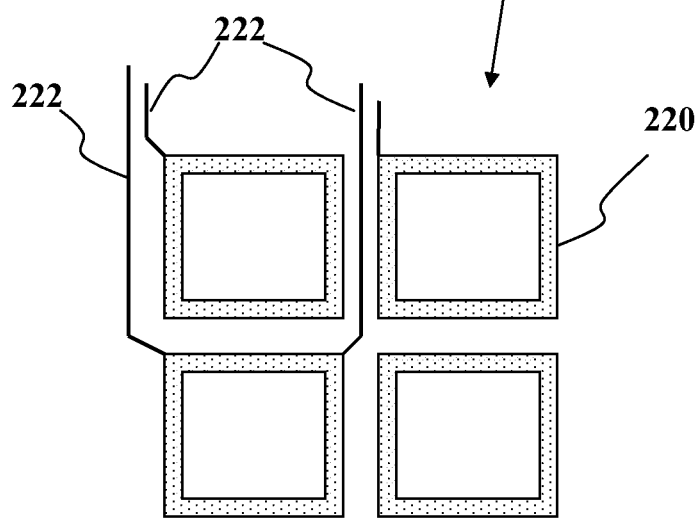
FIG. 2B illustrates a plan view of a portion of FIG. 2A.
Figure 2C:
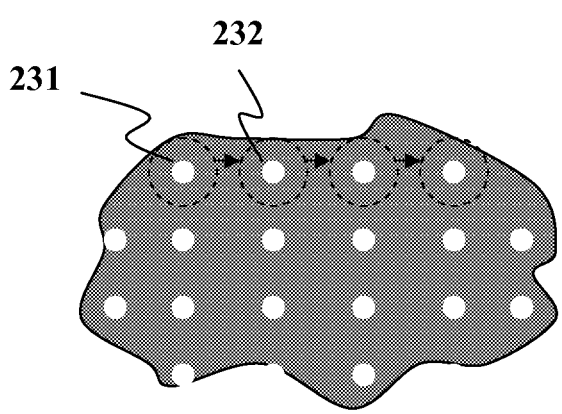
FIG. 2C illustrates an example of a scanning movement of electron beams in accordance with one aspect of the present disclosure.

The sample to be inspected (e.g., the substrate 200) may be supported by a holder in the chamber 120. The holder may be placed beneath an electron beam column of the e-beam tool 110 on a stage (e.g., an x-y stage). In one example, the sample is a test wafer with a number of current collection structures of an appropriate size and of an appropriate material to collect current to substrate information. FIG. 2A shows a semiconductor test wafer 200 which is divided into one or more scanner fields 210. By way of example, but not by way of limitation, each scanner field may be about 26 mm×33 mm in size. In general, there may be between about 100 and about 150 conductive pads 220 within each field. Each pad may be of a size between about 1 mm×1 mm and about 5 mm by 5 mm. As an example, each scanner field 210 may be subdivided into about 130 squares/pads 220 with 2 mm by 2 mm in size as shown in FIG. 2B. The pads 220 may act as current collectors for the interrogating electron beam from the electron beam tool 110. The collected current information is sent to the amplifier 130 via traces 222 that are electrically connected to the probing pins 132. FIG. 2C illustrates an example of an addressable scanning movement of an electron beam tool. For example, the electron beam tool 110 may emit an electron beam on a particular hole such as hole 231. The current to substrate information for this hole is collected by the current collector 220 and transmitted to the amplifier 130 and the display and control device 140 for analysis. The electron beam tool 110 then moves the electron beam and to scan the next hole 232.

Figure 3:
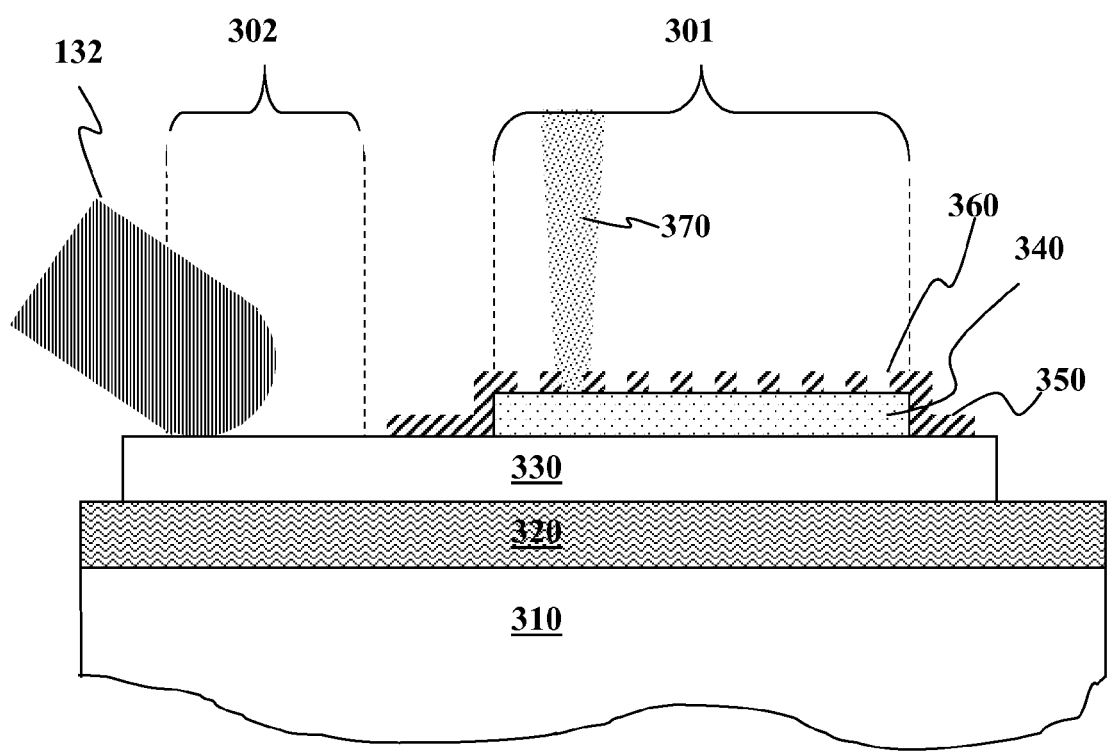
FIG. 3 illustrates in cross section view a part of a test wafer in accordance with an aspect of the present disclosure.

FIG. 3 illustrates in cross section view a part of a test wafer 200 of FIG. 2A. In this embodiment, the test wafer is built on a substrate 310, which may be substantially the same size and shape as a production semiconductor wafer used for fabricating integrated circuits. By way of example, and not by way of limitation, the substrate 310 may be a 300 mm silicon wafer. Other sizes, e.g., 150 mm, 200 mm, or 450 mm are also possible. The current collectors 220 may be formed in the substrate by standard semiconductor wafer lithographic processes. The current collectors 220 may be electrically isolated from each other by a layer 320 of a dielectric material, such as silicon dioxide, formed on top of the substrate 310. The dielectric layer 320 may be characterized by a low dielectric constant to minimize capacitance between the current collectors 220 and the silicon substrate 310.

To form a current collector (i.e., current collection structure) 220, a conductive layer 330 may be provided over the dielectric layer 320. The conductive layer 330 may be made of thin film aluminum, polysilicon, silicon carbide, tungsten or any other conductive materials. In addition, a layer 340 with low work function may be provided on top of the conductive layer 330 to enhance current collection. By way of example but not by way of limitation, the layer 340 may be made of Carbon (e.g., graphite) and Cesium. As such, a current collector is formed. Alternatively, the current collectors 220 may be formed on the backside of the wafer substrate 200 and the silicon vias and surface traces can be used for connection to the probing pins and the amplifiers.

To use the test wafer 200, a photoresist layer 350 may be formed on the surface of the wafer and patterned with desired geometry under test. The photoresist layer 350 may be patterned, e.g., with a pattern of holes 360. The pattern may be formed and developed in the resist layer through normal lithographic processes. As shown in FIG. 3, the test wafer 200 may include at least one test area 301 and a probe area 302. The test area 301 may include a number of current collectors 220. A probe area 302 is provided with exposed conductive contacts that are electrically connected to corresponding current collectors via conductive traces. Probe pins 132 may be placed against the probe pads to electrically connect to the current collector via traces. An electron beam 370 is scanned across the test area and a resulting current through the conductive layer 330 can be measured with the probe 132.

Conventionally, the readout bandwidth and signal to noise was limited by parasitic capacitance loading due to the wafer substrate. Aspects of the present disclosure sidestep this issue by using isolated current collecting pads of a much smaller dimension than the substrate 200. The smaller pads produce less parasitic capacitance and, consequently, have higher readout bandwidth. By way of example and not by way of limitation, if the beam current is above about 500 nA and the beam size is approximately the same size as the hole being tested, very fast scan speeds (over 10M holes per second) may be achieved. When the scan rate is high enough, the scan time can be as short as about 20 minutes.

Figure 4:
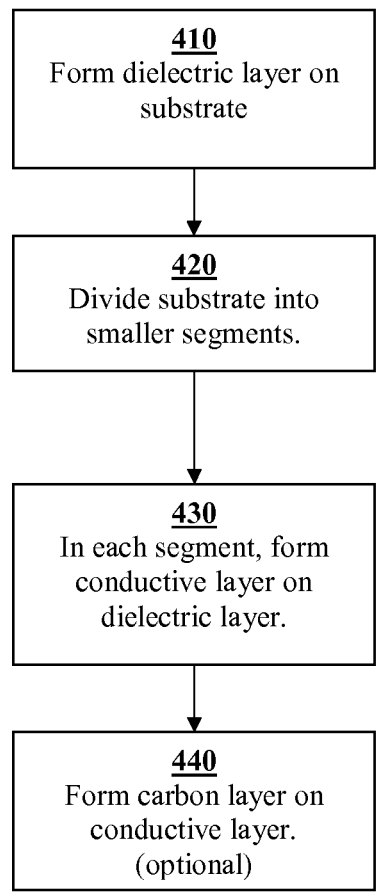
FIG. 4 is a flow chart illustrating manufacturing process steps to form current collection structures on a wafer for defect inspection according to one aspect of the present disclosure.
Figure 5:
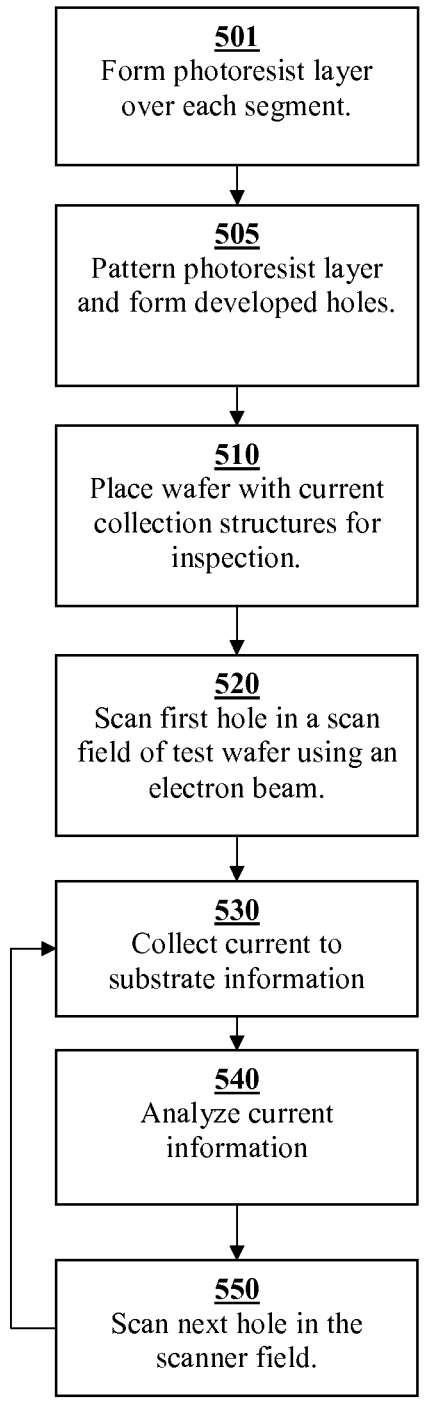
FIG. 5 is a flow chart illustrating an inspection process in accordance with one aspect of the present disclosure.

FIG. 4 is a flow chart illustrating manufacturing process steps to form current collection structures on a test wafer for defect inspection in accordance to one embodiment of the present disclosure. In step 410, a dielectric layer is formed over the silicon wafer substrate. In step 420, the substrate is divided into multiple scanner fields and each scanner field is divided into smaller segments in an appropriate size (such as 2 mm×2 mm squares). In step 430, a conductive layer is formed on the dielectric layer in each segment/pad. As noted above, there may be between about 100 and about 150 conductive pads. Each pad may be of a size between about 1 mm×1 mm and about 5 mm by 5 mm. In step 440, an optional Carbon layer may be formed over the conductive layer to provide a low work function surface that reduces backscattering of electrons. As such, a test wafer with current collection structures is formed. FIG. 5 is a flow chart illustrating an inspection procedure in accordance with one aspect of the present disclosure. In step 501, a photoresist layer is spin over the wafer covering the Carbon layer and the conductive layer for each pad. In step 505 the photoresist layer and developed to form holes. In step 510, a test wafer with current collection structures is placed on a stage beneath an electron beam column of an electron beam tool. In step 520, the electron beam tool emits electron beam that is directed to addressably scan a first hole in a scan field of the test wafer. In step 530, a current collector collects the current to substrate information for the hole. In step 540, the collected current is sent to an amplifier for signal enhancement. Then the amplified signal is sent to a display and control system. In step 550, the electron beam tool moves the beam to addressably scan the next hole in the same scanner field of the test wafer. Steps 530 to 550 are repeated until each hole in the scanner field is scanned.

Because the current collecting structures are small compared to the substrate, the parasitic capacitance is small and the bandwidth can be quite large. Also, instead of rastering the beam across the limited field, the electron beam addressably scans the location of each hole. The locations of the holes can be determined from fiducial marks on the wafer and a digital layout pattern for the holes and fiducial marks. The beam can be quickly directed to the location of each hole and may irradiate the hole with electrons for a longer period of time. This improves the signal to noise ratio.

Aspects of the present disclosure allow for fast scanning of large numbers of holes. By way of example, and not by way a limitation, a typical pattern may involve 50 nm diameter holes arranged in a grid with a 200 nm spacing between holes. According to aspects of the present invention, an array of such holes could be addressably scanned quite rapidly using an electron beam current of 500 nA with a beam diameter of 100 nm. An amplifier bandwidth of about 3 MHz corresponds to a pixel rate of about 1 million pixels per second. This allows a hole scanning rate of about 1 million holes per second, assuming 2.5 million electrons per pixel or about 25 pA. At 200 nm hole spacing a 2 mm×2 mm area of holes could be scanned in about 100 seconds. A 33 mm×26 mm field at 80% fill factor would contain 130 2 mm×2 mm squares. At a hole scanning rate of 1 million holes per second this field could be scanned in 3.6 hours. If the amplifier bandwidth is increased to 30 MHz (10 Mpixel/sec) the field can be scanned in about 20 minutes. The throughput may be increased by using multiple beams to scan the test area.

It is noted that the number of collectors is much smaller than the number of holes. It is not necessary to provide a separate collector for each hole. Instead, it is sufficient to make the overall area of the current collector pads small enough that their parasitic capacitance does not limit the bandwidth.

The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC §112, ¶6. In particular, the use of "step of" in the claims herein is not intended to invoke the provisions of 35 USC §112, ¶6.

What is claimed is:

1. An apparatus for use in defect inspection, comprising:
    a substrate, wherein the substrate is 150 mm or more in size;
    a dielectric layer provided on top of the substrate;
    a plurality of current collection structures provided on top of the dielectric layer, wherein the plurality of current collection structures covers a field in a size of a lithography exposure field or smaller, wherein the field is smaller than the size of the substrate, wherein each collection structure in the plurality includes a conductive pad that is smaller than the field and is in a size of about 1 mm×1 mm to about 5 mm×5 mm, wherein the conductive pad is configured to act as a current collector for interrogating an electron beam, wherein each collection structure is electrically connected to a corresponding exposed probe contact on a surface of the substrate, wherein the current collection structures are configured such that when a patterned layer of photoresist is formed on to of the current collection structures, the current collection structures collect current from an electron beam incident on the patterned layer of photoresist, the collected current indicative of the presence or absence of a defect in the patterned layer of photoresist.

2. The apparatus of claim 1, wherein each collection structure includes a layer of a low work function material over the conductive pad.

3. The apparatus of claim 2, wherein the low work function material is Carbon or Cesium.

4. The apparatus of claim 1, wherein there is only a single field of collection structures formed on the substrate.

5. The apparatus of claim 1, wherein each current collection structure is in a size of about 2 mm×2 mm and wherein the field includes 130 current collection structures, wherein the field is about 26 mm×33 mm in size.

6. The apparatus of claim 1, further comprising a patterned layer of photoresist formed over the current collection structures.

7. The apparatus of claim 6, wherein the patterned layer of photoresist includes a pattern of holes, wherein the pattern of holes includes a plurality of holes over each current collection structure.

8. A defect inspection system, comprising:
    an electron beam tool configured to emit one or more electron beams for addressable inspection of a plurality of holes within one or more fields on a wafer, wherein the electron beam tool is configured to direct an electron beam of the one or more electron beams to scan a first hole in a field of the one or more fields and collect current information of the first hole and wherein the electron beam tool is configured to move the electron beam to address a second hole next to the first hole in the field once current information of the first hole is collected;
    a chamber configured to receive the wafer;
    a probe card having a plurality of probe pins configured to contact a corresponding plurality of exposed probe contacts on a surface of the wafer;
    an array of amplifiers configured to receive collected current information from the probe pins;
    a control device configured to receive enhanced current information from the array of amplifiers and configured to locate defects based on the enhanced current information, wherein the wafer includes:
    a substrate 150 mm or more in size;
    a dielectric layer provided on top of the substrate;
    a plurality of current collection structures provided on to of the dielectric layer, wherein the plurality of current collection structures covers a field in a size of a lithography exposure field or smaller, wherein the field is smaller than the size of the substrate, wherein each collection structure in the plurality includes a conductive pad that is smaller than the field and is in a size of about 1 mm×1 mm to about 5 mm×5 mm, wherein the conductive pad is configured to act as a current collector for interrogating an electron beam, wherein each collection structure is electrically connected to a corresponding exposed probe contact on a surface of the substrate, wherein the current collection structures are configured such that when a patterned layer of photoresist comprising the plurality of holes is formed on top of the current collection structures, each current collection structure collects current information for a corresponding hole when the hole is scanned by an electron beam, the collected current information indicative of the presence or absence of a defect in the patterned layer of photoresist.

9. The system of claim 8, wherein the field is about 26 mm×33 mm in size.

10. The system of claim 8, wherein the electron beam tool is configured to addressably scan the holes formed in the field on the wafer.

11. The system of claim 8, wherein the electron beam tool is configured to change intensity and focus of the one or more electron beams corresponding to a particular hole to be scanned.

12. The system of claim 8, wherein the electron beam tool is configured to provide two or more electron beams.

13. The system of claim 8, wherein the amplifiers are built into the wafer.

14. The system of claim 8, wherein a scan speed of the electron beam tool is 1M holes per second or more.

15. The system of claim 8, wherein a scan speed of the electron beam tool is 10M holes per second or more.

16. A process for defect inspection on a limited field of a substrate, comprising:

forming a patterned photoresist layer with a pattern of developed holes over one or more current collection structures on a substrate, wherein the substrate is 150 mm or more in diameter, wherein each collection structure is smaller than the substrate, wherein each collection structure is configured to act as a current collector for interrogating an electron beam, and is in a size of about 1 mm×1 mm to about 5 mm×5 mm, wherein each collection structure is electrically connected to a corresponding probe contact on the substrate, wherein the current collection structures are configured such that when the patterned layer of photoresist is formed on to of the current collection structures, the current collection structures collect current from an electron beam incident on the patterned layer of photoresist, the collected current indicative of the presence or absence of a defect in the patterned layer of photoresist;

addressably scanning the pattern of developed holes with one or more electron beams;

receiving current information of the developed holes through the current collection structures;

displaying a current image showing current with respect to location of the developed holes; and locating defective holes based on the current image.

17. The process of claim 16, wherein the one or more current collection structures cover a limited field that is about 26 mm×33 mm in size.

18. The process of claim 17, wherein there are about 130 current collection structures in the limited field.

19. The process of claim 16 wherein there are multiple holes formed over each current collection structure.

20. The process of claim 16, wherein addressably scanning the pattern of developed holes with one or more electron beams includes scanning the holes at a rate of about 1 million holes per second or greater.

21. The process of claim 16, wherein addressably scanning the pattern of developed holes with one or more electron beams includes scanning the holes at a rate of about 10 million holes per second or greater.

22. The process of claim 16, wherein addressably scanning the pattern of developed holes with one or more electron beams includes addressably scanning the holes with two or more electron beams.

23. The process of claim 16, wherein forming the patterned photoresist layer includes varying a scanner focus or scanner intensity or both scanner focus and scanner intensity as a function of position in the pattern.

* * * * *